United States Patent [19]

Futatsugi et al.

[11] Patent Number: 5,031,005
[45] Date of Patent: Jul. 9, 1991

[54] SEMICONDUCTOR DEVICE

[75] Inventors: Toshiro Futatsugi, Isehara; Naoki Yokoyama; Kenichi Imamura, both of Atsugi, all of Japan

[73] Assignee: Fujitsu Limited, Kawasaki, Japan

[21] Appl. No.: 111,018

[22] Filed: Oct. 21, 1987

[30] Foreign Application Priority Data

Oct. 22, 1986 [JP] Japan .................................. 61-249572
Nov. 20, 1986 [JP] Japan .................................. 61-276953

[51] Int. Cl.[5] .................. H01L 29/72; H01L 29/205; H01L 33/00; H01L 29/08
[52] U.S. Cl. ........................................ 357/4; 357/12; 357/16; 357/17; 357/34
[58] Field of Search ...................... 357/45 L, 16, 4, 12, 357/34, 17

[56] References Cited

U.S. PATENT DOCUMENTS 4,712,121 12/1987 Yokoyama ............................ 357/34
4,780,749 10/1988 Schulman ............................. 357/16

FOREIGN PATENT DOCUMENTS 0159273 10/1985 European Pat. Off. .
0226383 6/1987 European Pat. Off. .

OTHER PUBLICATIONS

IBM Technical Disclosure Bulletin, vol. 27, No. 5, Oct. 1984, pp. 3053-3056, New York, U.S.A.; B. Ricco et al.: "Tunable Resonant Tunnelling Semiconductor Emitter Structure", whole document.

*Primary Examiner*—William D. Larkins
*Attorney, Agent, or Firm*—Staas & Halsey

[57] ABSTRACT

A semiconductor device comprises stacked first through fifth semiconductor layers. The semiconductor device has an energy level condition of $|Ec_3-Ec_1| \approx |Ev_3-Ev_5|$, where $Ec_3$ is a resonant energy level of electrons in a conduction band of the third layer and $Ev_3$ is a resonant energy level of holes in a valence band thereof, and $Ec_1$ is an energy level of a conduction band of the first layer and $Ev_5$ is an energy level of a valence band of the fifth layer.

7 Claims, 13 Drawing Sheets

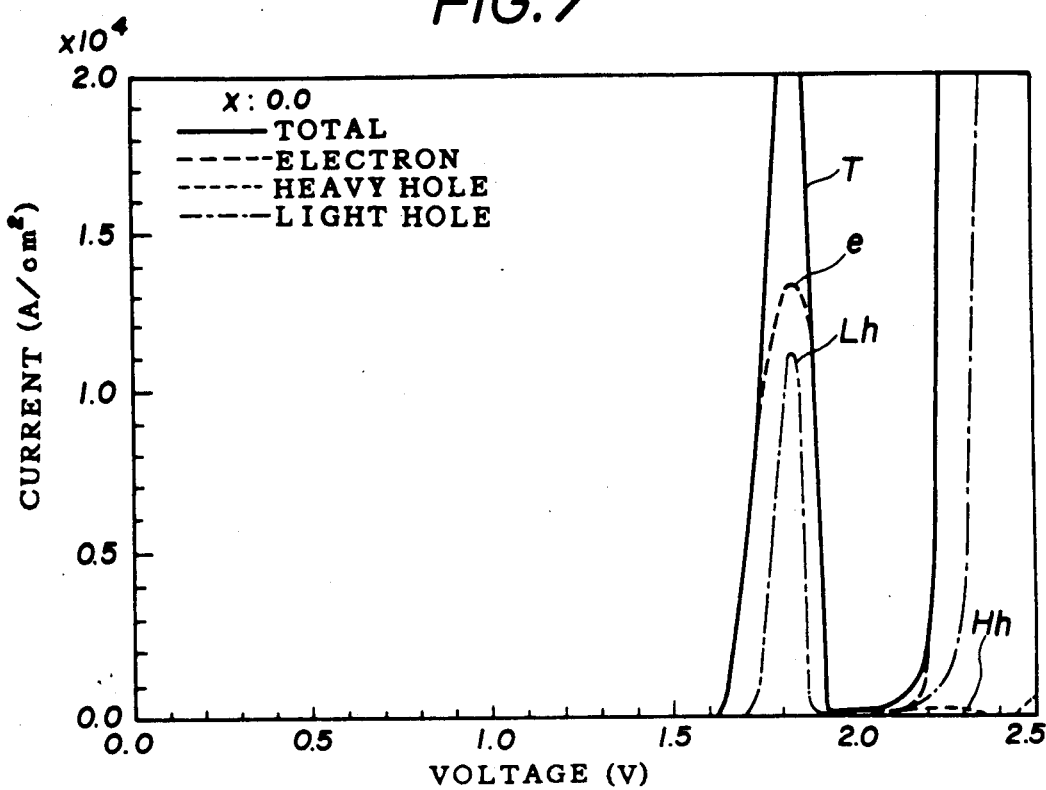
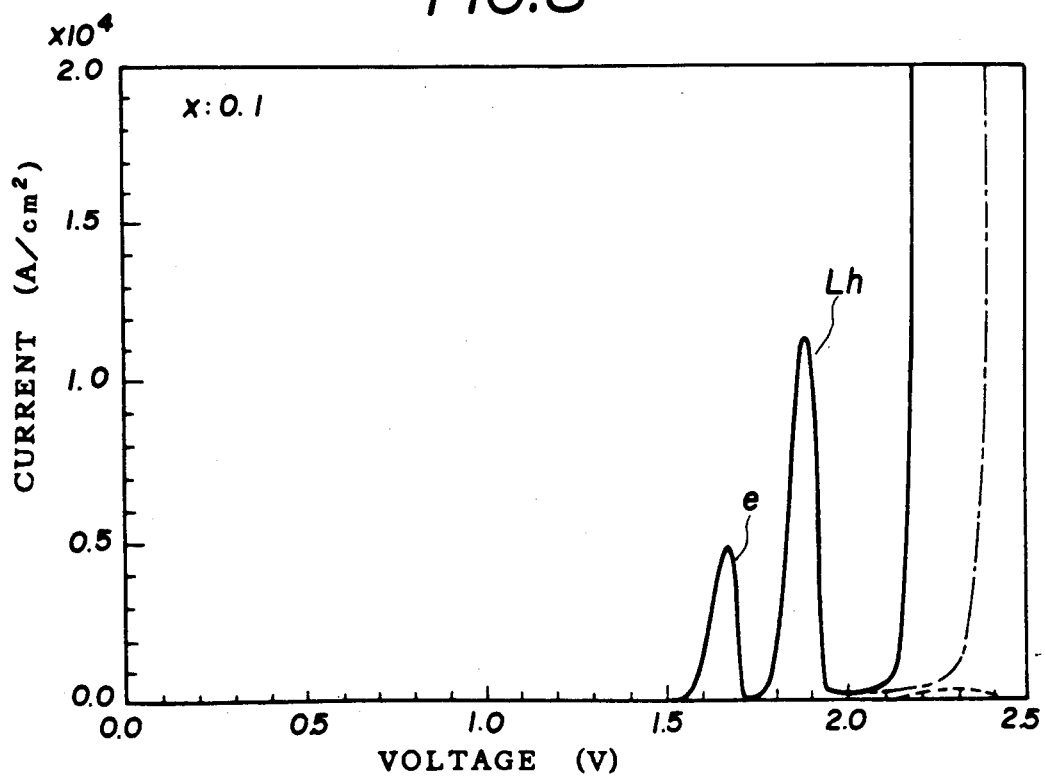

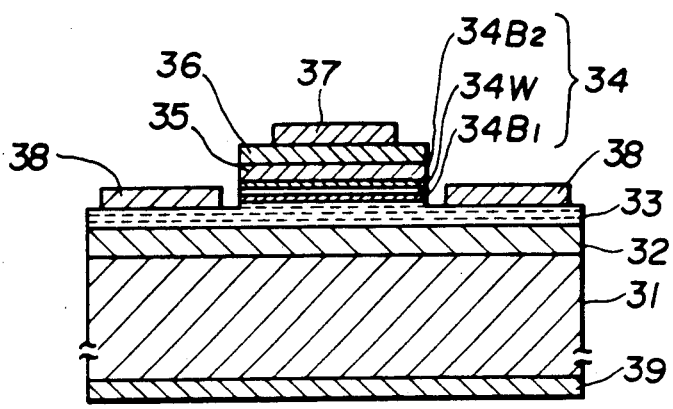
FIG.17A
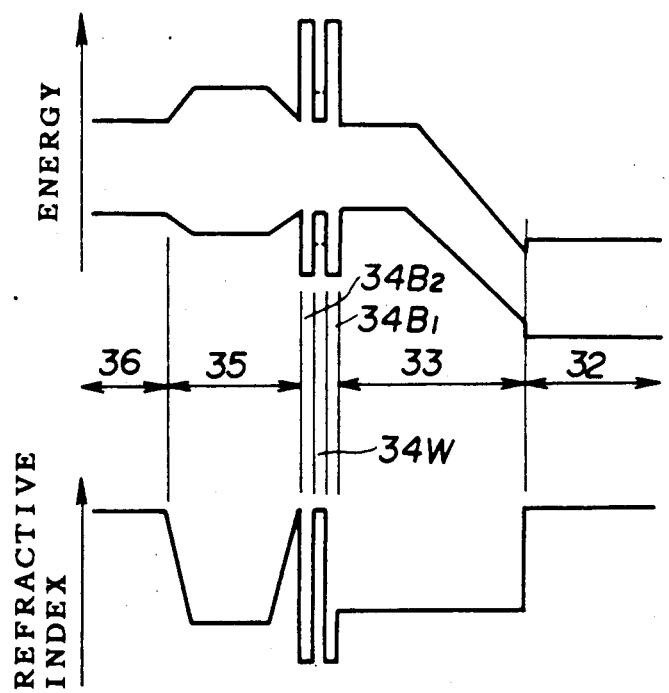
FIG.17B
FIG.17C

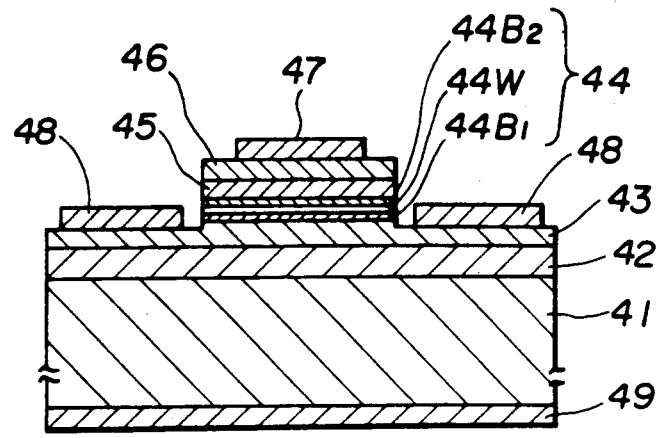
FIG.18A
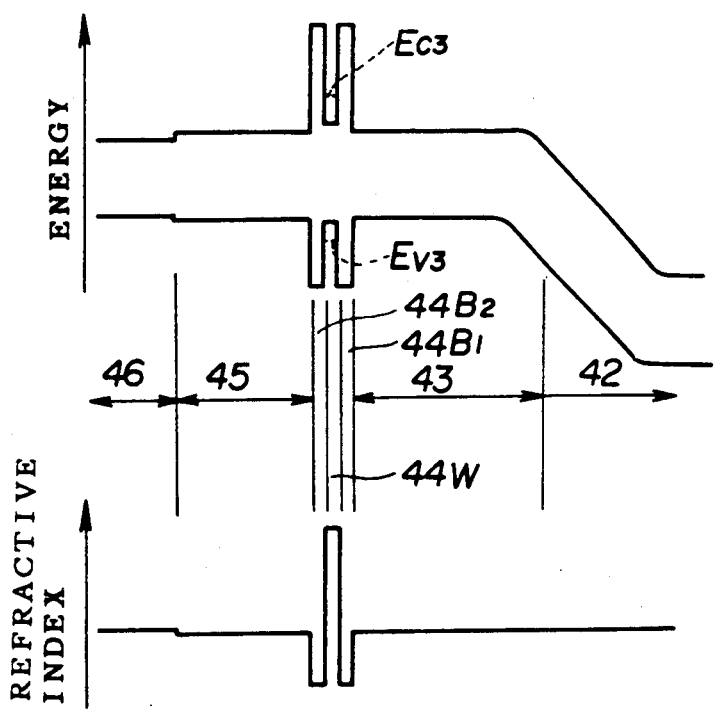
FIG.18B
FIG.18C

SEMICONDUCTOR DEVICE

BACKGROUND OF THE INVENTION

The present invention generally relates to semiconductor devices, and in particular to improvements of a semiconductor device utilizing a resonant-tunneling effect which is offered by resonant-tunneling barriers generated by a well layer and potential barriers positioned on opposing sides of the well layer.

Currently, semiconductor devices utilizing resonant-tunneling are proposed and fabricated as electronic devices. Examples of these are a resonant-tunneling diode (generally abbreviated as RTD), a resonant-tunneling hot electron transistor (generally abbreviated as RHET) and a resonant-tunneling bipolar transistor (generally abbreviated as RBT). These semiconductor devices have new functions and a high-speed performance which are not provided by conventional semiconductor devices. For example, it is possible to build an Exclusive-NOR gate or a flip-flop circuit using only one RHET.

Out of the above semiconductor devices utilizing the resonant-tunneling effect, the RBT employs a structure in which resonant-tunneling potential barriers are inserted into p-n interfaces, and electrons and holes are involved its operation. For example, a quantum well layer is inserted between an n-type aluminum-gallium-arsenic (AlGaAs) emitter layer and a p$^+$-type gallium-arsenic (GaAs) base layer. The quantum well layer consists of a GaAs well layer and AlAs barrier layers positioned on both sides of the GaAs well layer. The RBT thus structured exhibits peaks of both the collector and base currents with respect to the base-emitter valtage for the common emitter configuration. The peaks indicate that resonant-tunneling currents flow through the p-n junction. Of course, electrons are a carrier of the collector current, and holes are a carrier of the base current.

Also, it is known that many carriers are stored in the well layer of the quantum well layer under the resonant-tunneling. That is, the electron concentration and the hole concentration in the well layer are higher than those in other layers under the resonant-tunneling. However, it should be noted that in the conventional structures of the RBT, the resonant-tunneling of electrons and the resonant-tunneling of holes do not occur at the same time. In other words, a base-emitter voltage at which the resonant-tunneling of electrons occurs differs from a base-emitter voltage at which the resonant-tunneling of holes occurs.

Therefore, the present inventors considered that if simultaneous occurrence of the resonant-tunneling of electrons and holes were obtainable and an electron concentration and a hole concentration in the well layer were thus increased, the electrons and holes in the well layer could be recombined, so that the current density could be enhanced and light could be emitted in the well layer.

SUMMARY OF THE INVENTION

Accordingly, a general object of the present invention is to provide an improved semiconductor device utilizing the resonant-tunneling effect.

A more specific object of the present invention is to provide a semiconductor device in which the resonant-tunneling of electrons and the resonant-tunneling of holes can occur at the same time.

Another object of the present invention is to provide a semiconductor device which can emit light in a quantum well layer, so that the semiconductor device can function as both an electronic device and an optical device.

Still another object of the present invention is to provide a semiconductor device which is suitable for fabrication of an optoelectronic integrated circuit.

The foregoing objects of the present invention are accomplished by providing a semiconductor device comprising a first n-type semiconductor layer having an energy level $Ec_1$ at the bottom of its conduction band and an energy level $Ev_1$ at the top of its valence band; a second semiconductor layer having an energy level $Ec_2 (>Ec_1)$ at the bottom of its conduction band and an energy level $Ev_2 (<Ev_1)$ at the top of its valence band, the second layer being deposited on a surface of the first layer; a third semiconductor layer having a resonant energy level $Ec_3 (<Ec_2)$ of electrons in its conduction band and a resonant energy level $Ev_3 (>Ev_2)$ of holes in its valence band, the third layer being deposited on a surface of the second layer; a fourth semiconductor layer having an energy level $Ec_4 (>Ec_3)$ at the bottom of its conduction band and an energy level $Ev_4 (<Ev_3)$ at the top of its valence band, the fourth layer being deposited on a surface of the third layer; and a fifth p-type semiconductor layer having an energy level $Ec_5 (<Ec_4)$ at the bottom of its conduction band and an energy level $Ev_5 (>Ev_4)$ at the top of its valence band, the fifth layer being deposited on a surface of the fourth layer; wherein $|Ec_3 - Ec_1|$ is approximately equal to $|Ev_3 - Ev_5|$.

Other objects and features of the present invention will become apparent from the following detailed description in conjunction with the attached drawings.

BRIEF DESCRIPTION OF THE DRAWINGS

FIG. 7 is a graph of a current-voltage characteristic corresponding to the case shown in FIG. 6A;

FIG. 8 is a graph of a current-voltage characteristic corresponding to the case shown in FIG. 6B;

FIG. 17A is a cross sectional view of a modification of the semiconductor device shown in FIG. 10;

FIG. 17B is a schematic energy band diagram of the semiconductor device shown in FIG. 17A;

FIG. 17C is a graph of a refractive index distribution of the semiconductor device shown in FIG. 17C;

FIG. 18A is a cross sectional view of another modification according to the present invention;

FIG. 18B is a schematic energy band diagram of the semiconductor device shown in FIG. 18A; and FIG. 18C is a graph of a refractive index distribution of the semiconductor device shown in FIG. 18A.

DETAILED DESCRIPTION

A description will first be given of a conventional RBT to facilitate a better understanding of the present invention described later.

As described in the foregoing, the RBT has the structure in which resonant-tunneling potential barriers are inserted into p-n interfaces, and electrons and holes are involved its operation.

Figure 1:
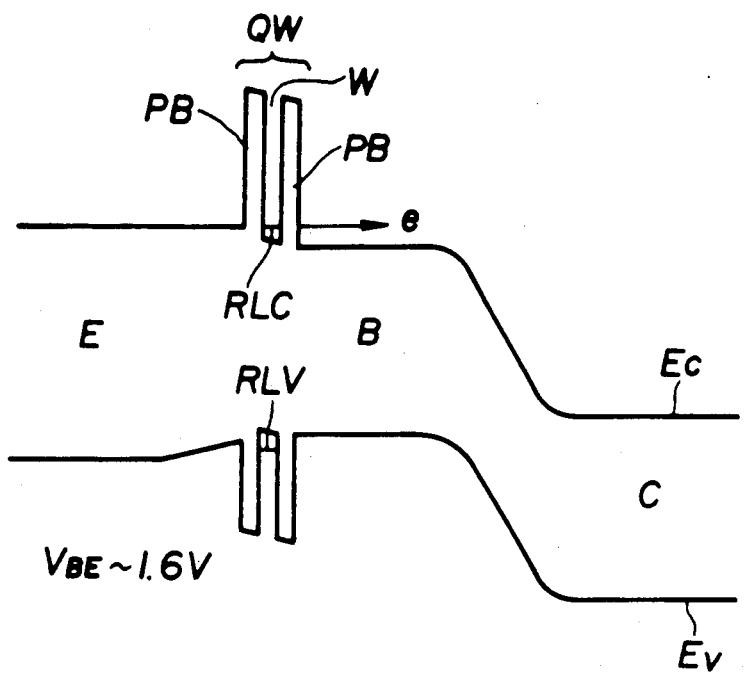
FIG. 1 is a schematic energy band diagram of a resonant-tunneling bipolar transistor (RBT)

FIG. 1 is a schematic energy band diagram of the conventional RBT. A quantum well layer QW is inserted between an n-AlGaAs emitter layer E and a p$^+$-GaAs base layer B. The quantum well layer QW consists of a GaAs well layer W and AlAs barrier layers PB positioned on both sides of the GaAs well layer W. An n-GaAs collector layer C is adjacent to the p$^+$-GaAs base layer B. RLC and RLV represent resonant energy levels of electrons and holes, respectively, and e indicates electrons. The illustrated energy band diagram may be obtained with a base-emitter voltage $V_{BE}$ of approximately 1.6 (V) applied across the base and emitter.

Figure 2:
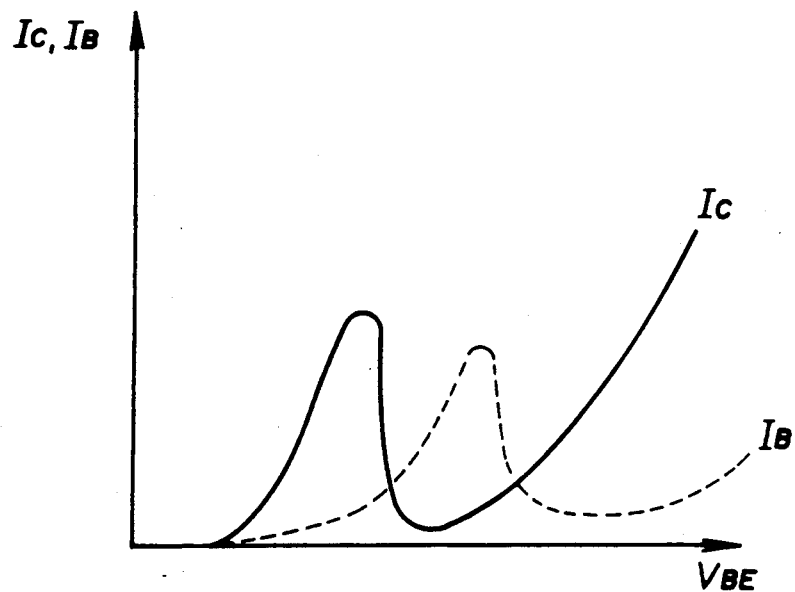
FIG. 2 is a graph of current-voltage characteristics of the RBT.

FIG. 2 is a graph of current-voltage characteristics of the RBT having the energy band diagram shown in FIG. 1. The horizontal axis represents the base-emitter voltage $V_{BE}$, and the vertical axis represents the collector current $I_C$ and the base current $I_B$. A curved solid line is a characteristic line of the collector current $I_C$ and a curved broken line is a characteristic line of the base current $I_B$. As apparent from FIG. 2, there are peaks in both the collector current $I_C$ and the base current $I_B$. This means that resonant-tunneling currents flow in the peak current regions. Of course, electrons are the carrier of the collector current $I_C$ and holes are the carrier of the base current $I_B$.

As mentioned before, in the quantum well layer QW of the RBT, many carriers may be stored in the well layer W in the state of the resonant-tunneling.

Figure 3:
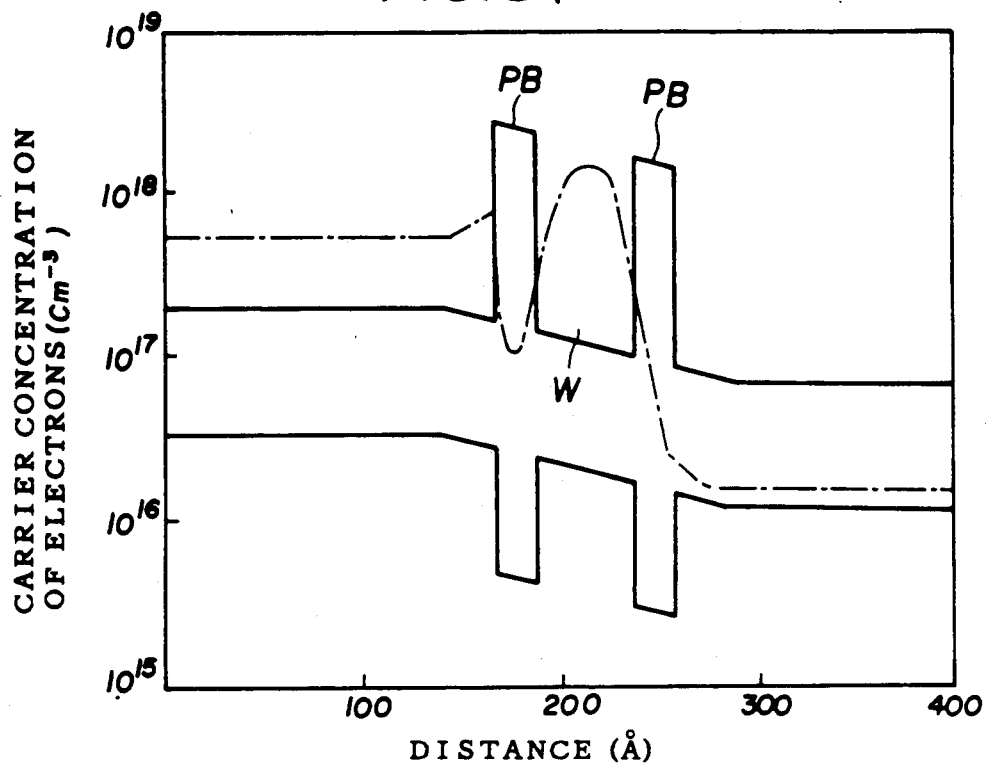
FIG. 3 is a view for explaining storage of a carrier (electrons) in a well layer.
Figure 4:
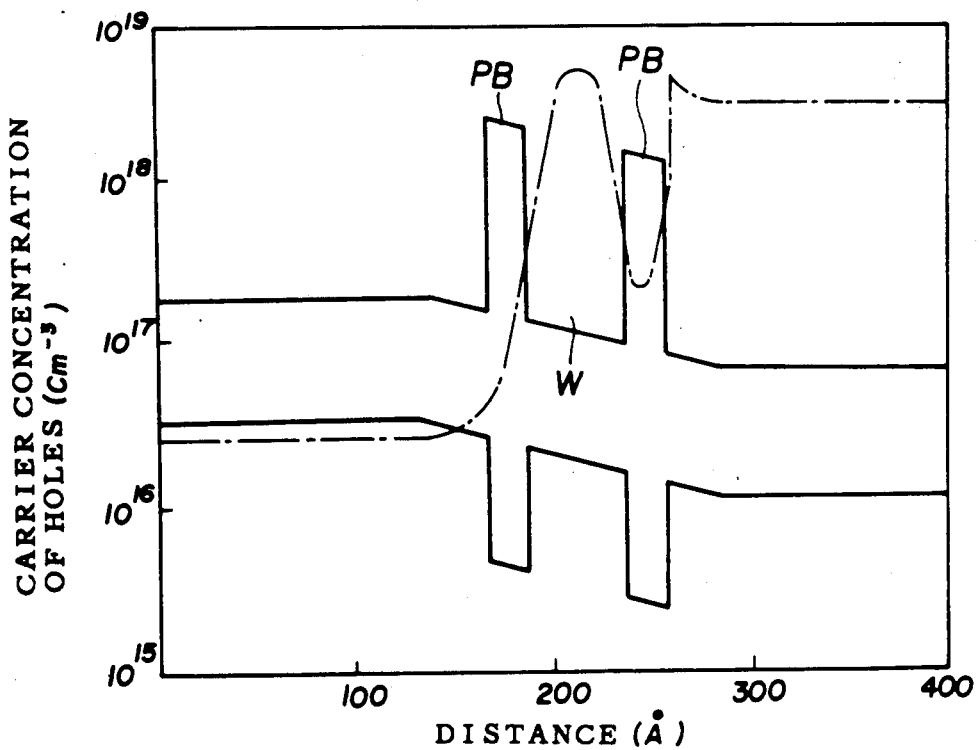
FIG. 4 is a view for explaining storage of a carrier (holes) in the well layer.

FIGS. 3 and 4 are schematic energy band diagrams for explaining storage of the carriers of electrons and holes in the well layer W, respectively. In these figures, the same reference symbols as those in FIGS. 1 and 2 indicate the same elements or have the same meanings. The horizontal axes of FIGS. 3 and 4 represent a distance measured from the emitter side, and the vertical axes represent a carrier concentration. A dotted chain line in FIG. 3 shows an electron concentration and a dotted chain line in FIG. 4 shows a hole concentration. As shown in the figures, the electron concentration and the hole concentration are increased in the well layer W. However, it should be noted that increases in the concentration of electrons and holes do not occur at the same time.

Therefore, one object of the present invention is intended to simultaneously produce the occurrence of the resonant-tunneling of electrons and holes.

Figure 5A:
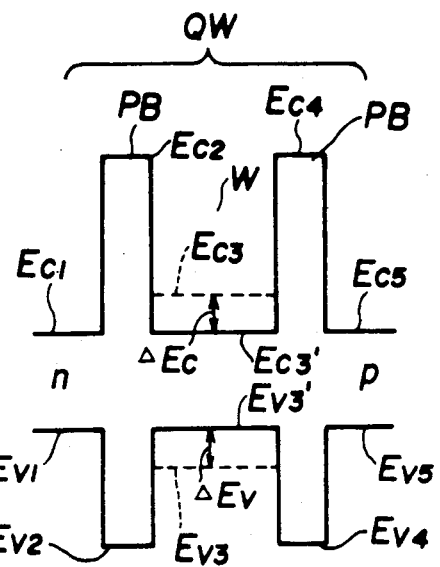
FIGS. 5A through 5C are schematic energy band diagrams for explaining an essential feature of the present invention.
Figure 5B:
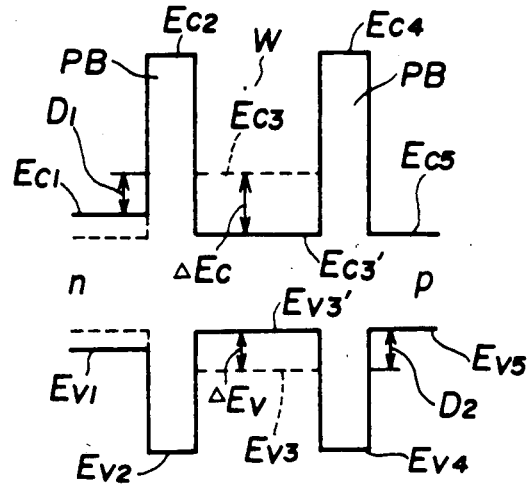
Figure 5C:
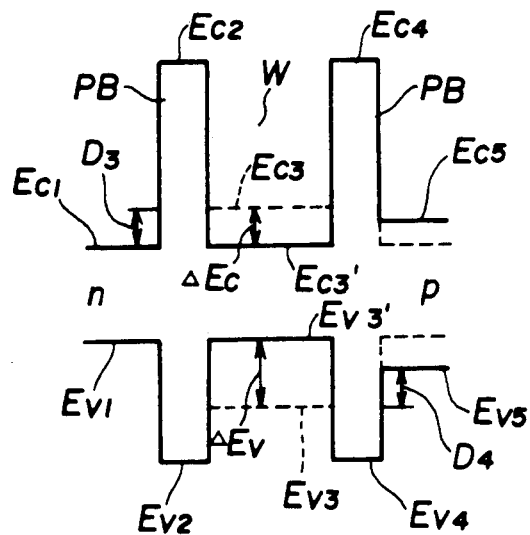

FIGS. 5A through 5C are schematic energy band diagrams of a structure where the quantum well layer QW is sandwiched by an n-semiconductor layer and a p-semiconductor layer. For simplicity, the energy band diagrams are illustrated in a state where a bias voltage which corresponds to a difference between Fermi levels of the n- and p-semiconductor layers is applied across the n- and p-semiconductor layers. In FIGS. 5A through 5C, the same reference symbols as those in the previous figures indicate the same elements or have the same meanings. A symbol $Ec_1$ represents an energy level at the bottom of a conduction band of the n-semiconductor layer. $Ev_1$ represents an energy level at the top of a valence band of the n-semiconductor layer. $Ec_2$ and $Ev_2$ represent energy levels at the bottom and top of conduction and valence bands of the barrier layer PB on the side of the n-semiconductor layer, respectively. The energy level $Ec_2$ is larger than the energy level $Ec_1$, whereas energy level $Ev_2$ is smaller than energy level $Ev_1$. $Ec_3$ represents a resonant energy level of electrons in a conduction band of the well layer W. $Ev_3$ represents a resonant energy level of holes in a valence band of the well layer W. The energy level $Ec_3$ is smaller than the energy level $Ec_2$, and the energy level $Ev_3$ is larger than the energy level $Ev_2$. $Ec_4$ and $Ev_4$ represent energy levels at the bottom and top of conduction and valence bands of the barrier layer PB on the side of the p-semiconductor layer, respectively. The energy level $Ec_4$ is larger than the energy level $Ec_3$, and the energy level $Ev_4$ is smaller than the energy level $Ev_3$. $Ec_5$ represents an energy level at the bottom of a conduction band of the p-semiconductor layer. $Ev_5$ represents an energy level at the top of a valence band of the p-semiconductor layer. The energy level $Ec_5$ is smaller than the energy level $Ec_4$, and the energy level $Ev_5$ is larger than the energy level $Ev_4$.

In order to achieve the simultaneous occurrence of the resonant-tunneling of electrons and holes according to the present invention, the following condition must be satisfied:

$$|Ec_3 - Ec_1| \approx |Ev_3 - Ev_5|$$

This condition depends on the relationship between the energy levels of $Ec_3$ and $Ev_3$.

It is now assumed that $\Delta Ec$ is a difference (absolute value) between the resonant energy level $Ec_3$ and an energy level $Ec_3'$ at the bottom of the conduction band of the well layer W. It is further assumed that $\Delta Ev$ is a difference (absolute value) between the resonant energy level $Ev_3$ and an energy level $Ev_3'$ at the top of the valence band of the well layer W.

First, when the energy $\Delta Ec$ is approximately equal to the energy $\Delta Ev$ as shown in FIG. 5A, energy levels $Ec_1$ and $Ev_1$ are approximately equal to energy levels $Ec_5$ and $Ev_5$, respectively. Therefore, the above condition is necessarily satisfied.

Secondly, when the energy $\Delta Ec$ is larger than the energy $\Delta Ev$ as shown in FIG. 5B, the energy level $Ec_1$ is selected so that an absolute value of a difference $D_1$ between the energy levels $Ec_1$ and $Ec_3$ becomes nearly equal to an absolute value of a difference $D_2$ between the energy levels $Ev_3$ and $Ev_5$. In other words, as shown in FIG. 5B, the band gap of the n-semiconductor layer is made wider so as to satisfy the above condition.

Thirdly, when the energy $\Delta Ec$ is smaller than the energy $\Delta Ev$ as shown in FIG. 5C, the energy level $Ev_5$ is selected so that an absolute value of a difference $D_4$ between the energy levels $Ev_3$ and $Ev_5$ becomes nearly equal to an absolute value of a difference $D_3$ between $Ec_1$ and $Ec_3$. In other words, as shown in FIG. 5C, the band gap of the p-semiconductor layer is made wider so as to satisfy the above condition.

As a result, according to the present invention, it becomes possible to provide semiconductor devices such as a diode, an npn transistor and a pnp transistor, in which the resonant-tunneling of electrons and the resonant-tunneling of holes may occur at the same time with a suitable voltage applied across the n-and p-semiconductor layers.

The relationship between the energy levels $Ec_3$ and $Ev_3$ depends on materials and a width of the well layer W, a height and a width of the barrier layers PB and so on. In detail, the above condition may be satisfied with respect to the conventional RBT having the structure and properties described in the foregoing by means of the following:

(1) Suitably selecting a mole fraction or a mixed crystal ratio x of the $Al_xGa_{1-x}As$ emitter layer E;
(2) Suitably selecting a width of the well layer W;
(3) Suitably selecting a number of the well layer W;
(4) Suitably selecting a potential barrier height by changing a material of the barrier layers PB;
(5) Suitably selecting a width of the barrier layers PB;
(6) Suitably selecting an impurity concentration of the emitter layer E; and
(7) Suitably selecting an impurity concentration of the base layer B.

The above condition for the simultaneous occurrence of the resonant-tunneling of electrons and holes can be achieved by optimizing one of the above listed means or arbitrary combinations thereof.

A description will be given on a case where a mole fraction x of the $Al_xGa_{1-x}As$ emitter layer E is optimized to produce the occurrence of the resonant-tunneling of electrons and the resonant-tunneling of holes at the same time, as an example of the principle of the present invention mentioned above.

Figure 6A:
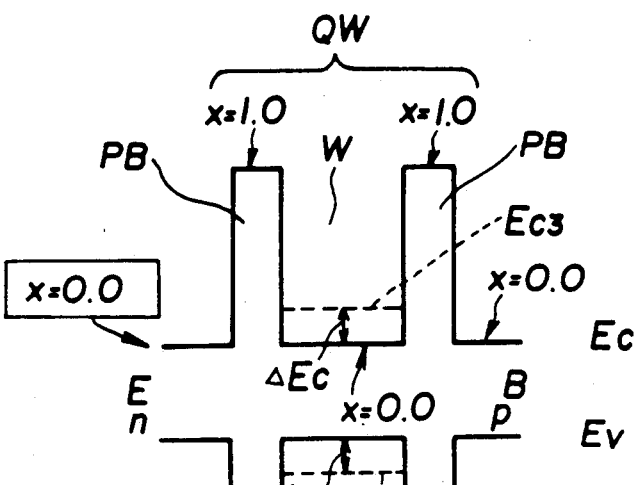
FIGS. 6A through 6C are schematic energy band diagrams for explaining simultaneous occurrence of resonant-tunneling of electrons and holes, by varying a mole fraction x of an emitter layer of the RBT.
Figure 6B:
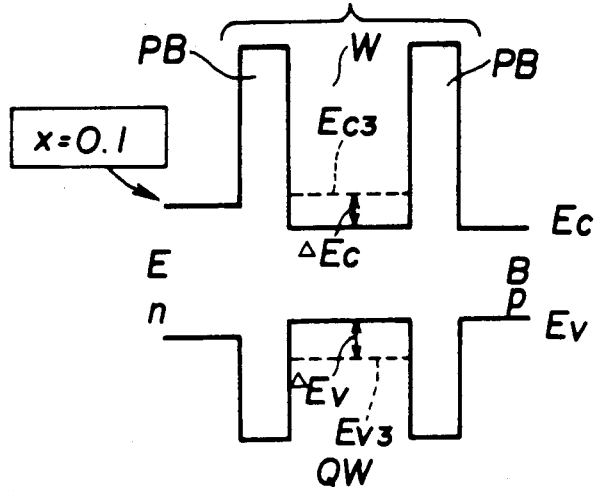
Figure 6C:
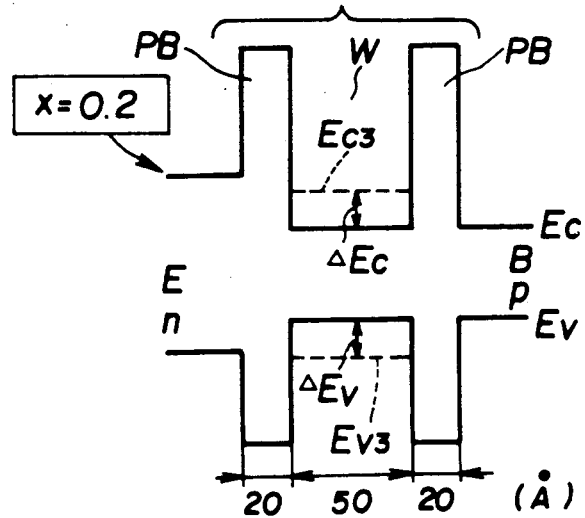

FIGS. 6A through 6C are schematic energy band diagrams each having different x values of the $Al_xGa_{1-x}As$ emitter layer E in the RBT. FIGS. 6A, 6B and 6C correspond to cases where x=0.0, x=0.1, and x=0.2, respectively. Specifications of essential elements of the RBT having the energy band diagrams shown in FIGS. 6A through 6C are as follows:

Barrier layers PB
    x-value: 1.0 (AlAs)
    thickness: 20 (Å)
Well layer W
    x-value: 0.0 (GaAs)
    thickness: 50 (Å).

Figure 9:
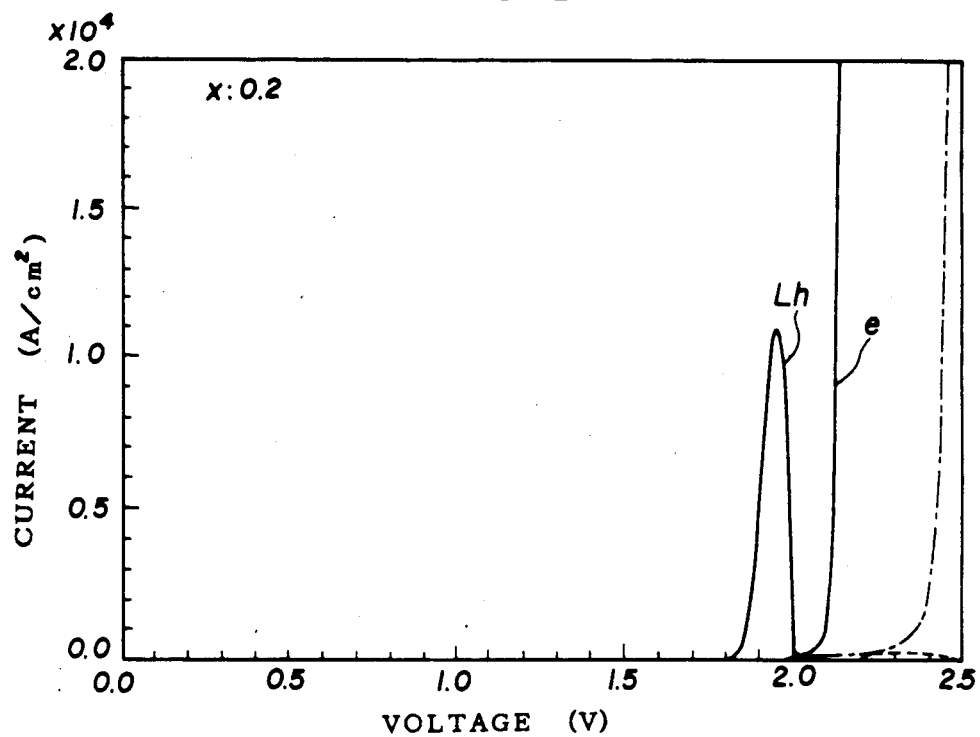
FIG. 9 is a graph of a current-voltage characteristic corresponding to the case shown in FIG. 6C.

FIGS. 7, 8 and 9 show current-voltage characteristics which correspond to FIGS. 6A, 6B and 6C, respectively. In each figure, the horizontal axis represents an applied voltage and the vertical axis represents a current. Further, a long broken line indicated by a character e is a characteristic line relating to the current caused by the motion of electrons. A dotted chain line indicated by a character L is a characteristic line relating to the current caused by the motion of light holes. A short broken line indicated by a character Hh is a characteristic line relating to the current due to heavy holes. A solid line indicated by a character T is a characteristic line relating to a total current.

As apparent from FIGS. 6A and 7, in a case where the mole fraction x of the emitter layer E is equal to 0.0, the resonant-tunneling of electrons and the resonant-tunneling of (light) holes occur at the same time, when the base-emitter voltage is approximately 1.82 (V). Heavy holes cannot penetrate the potential barriers PB because of their weight.

As apparent from FIGS. 6B and 8, in a case where the mole fraction x of the emitter layer E is equal to 0.1, the resonant-tunneling of electrons occurs with the base-emitter voltage of approximately 1.65 (V), whereas the resonant-tunneling of holes occurs when the base-emitter voltage of approximately 1.87 (V) is applied.

As apparent from FIGS. 6C and 9, in a case where the mole fraction x of the emitter layer E is equal to 0.2, the resonant-tunneling of electrons does not occur, whereas the resonant-tunneling of holes occurs when the base-emitter voltage is approximately 1.94 (V).

The measurement results indicate that occurrence of the resonant-tunneling of electrons and the resonant-tunneling of holes may be controlled by selecting the mole fraction x of the emitter layer E. In the samples of RBTs used in the measurement, the simultaneous occurrence of both the resonant-tunneling of electrons and the resonant-tunneling of holes are found when the mole fraction x of the emitter layer E is equal to 0.0. However, it should be noted that the simultaneous occurrence can also be obtained by setting a different mole fraction x of the emitter layer E by varying parameters other than the mole fraction x, for example the width of the well layer W.

The above measurement results prove that it is possible to produce the occurrence of the resonant-tunneling of electrons and the resonant-tunneling of holes at the same time and to thereby store and recombine electrons and holes in the well layer W by selecting one or more of the above mentioned means (1) to (7). Accordingly, the current density can be improved. In addition, due to the recombination of the electrons and holes, light-emission in the well layer W is obtainable. This light-emission may be modulated at a high-speed due to the properties of the semiconductor device. Therefore, the semiconductor device according to the present invention is suitable for high-speed light communications. Of course, the semiconductor device of the present invention may operate as the conventional RBT by controlling the base-emitter voltage. For this reason, the present semiconductor device is suitable for fabrication of an optoelectronic integrated circuit (generally abbreviated as an OEIC).

A description will be given on an example of a semiconductor device according to the present invention.

Figure 10:
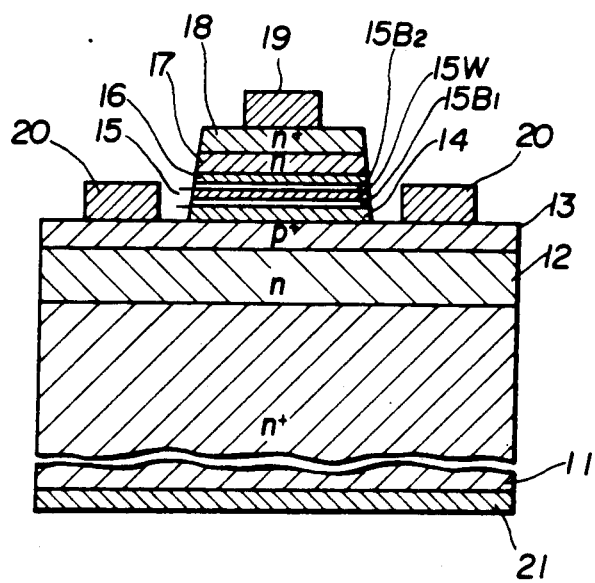
FIG. 10 is a cross sectional view of an example of a semiconductor device according to the present invention.

FIG. 10 shows a schematic cross section of an example of a semiconductor device according to the present invention. The illustrated semiconductor device is one example of an npn transistor which may be obtained according to the present invention. Referring to this figure, a quantum well layer 15 is inserted between p+-GaAs base layer 13 and an n-GaAs emitter layer 17 through a non-doped GaAs spacer layer 14 and a non-doped GaAs spacer layer 16, respectively. The quantum well layer 15 consists of a GaAs well layer 15W and AlAs potential barrier layers $15B_1$ and $15B_2$ which are positioned on the bottom and top surfaces of the GaAs well layer 15W, respectively. The quantum well layer 15 may be grown by molecular beam epitaxy (MBE), for example. The spacer layer 14 is provided to prevent impurities which are doped in the p+-GaAs base layer 13, beryllium (Be), for example, from diffusing into the barrier layer $15B_1$ and to thereby prevent the diffused impurities from exerting the impurity scattering effect on electrons and holes. Similarly, the spacer layer 16 is provided to prevent impurities doped in the n-GaAs emitter layer 17, silicon (Si), for example, from diffusing into the barrier layer $15B_2$ and to prevent occurrence of the impurity scattering effect. The p+-GaAs base layer 13 is deposited on an n-GaAs collector layer 12. This structure may be grown on an n+-GaAs substrate 11 by molecular beam epitaxy (MBE), for example. On the top surface of the p+-GaAs base layer 13, there are metallized base electrodes 20. On the top surface of the n-GaAs emitter layer 17, there is metallized an emitter electrode 19 through an n+-emitter contact layer 18. A collector electrode 21 is metallized on the bottom surface of the n+-GaAs substrate 11.

Specifications of essential parts of the configuration illustrated in FIG. 10 are shown in TABLE I.

TABLE I

| Layer | Composition | Impurity (cm$^{-3}$) | Thickness (nm) |
| --- | --- | --- | --- |
| Substrate 11 | GaAs | n+ —6 × 10$^{18}$ | |
| Collector 12 | GaAs | n —1 × 10$^{17}$ | 500 |
| Base 13 | GaAs | p+—5 × 10$^{18}$ | 200 |
| Spacer 14 | GaAs | non-doped | 20 |
| Barrier 15B$_1$ | AlAs | non-doped | 2 |
| Well 15W | GaAs | non-doped | 5 |
| Barrier 15B$_2$ | AlAs | non-doped | 2 |
| Spacer 16 | GaAs | non-doped | 5 |
| Emitter 17 | GaAs | n —5 × 10$^{17}$ | 100 |
| Contact 18 | GaAs | n+ —6 × 10$^{18}$ | 200 |
| Electrode 19 | AuGe/Au/WSi | | 20/100/300 |
| Electrode 20 | Au/Zn/Au | | 10/10/300 |
| Electrode 21 | AuGe/Au | | 20/300 |

Figure 11A:
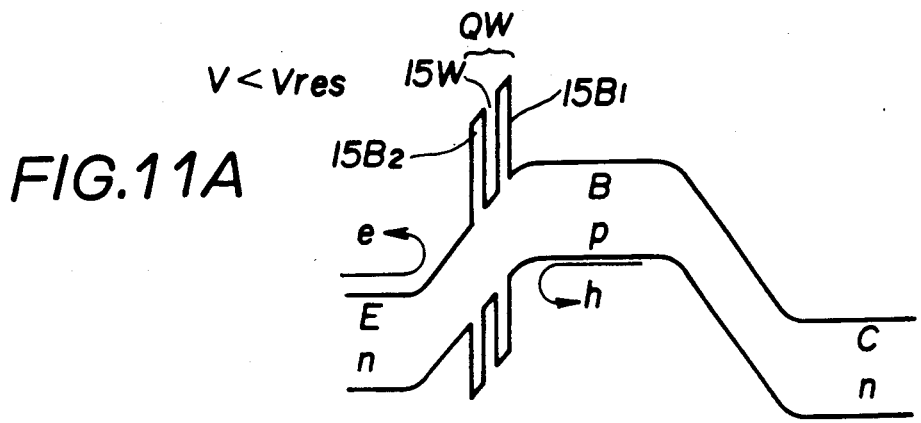
FIGS. 11A through 11C are schematic energy band diagrams for explaining operation of the semiconductor device shown in FIG. 10.
Figure 11B:
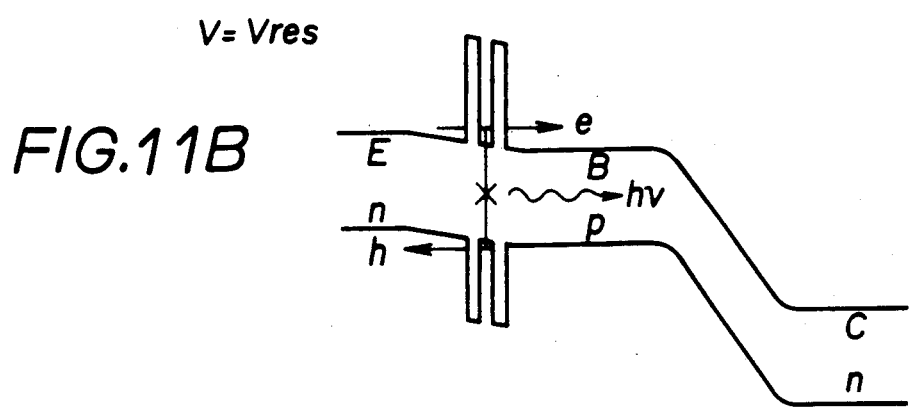
Figure 11C:
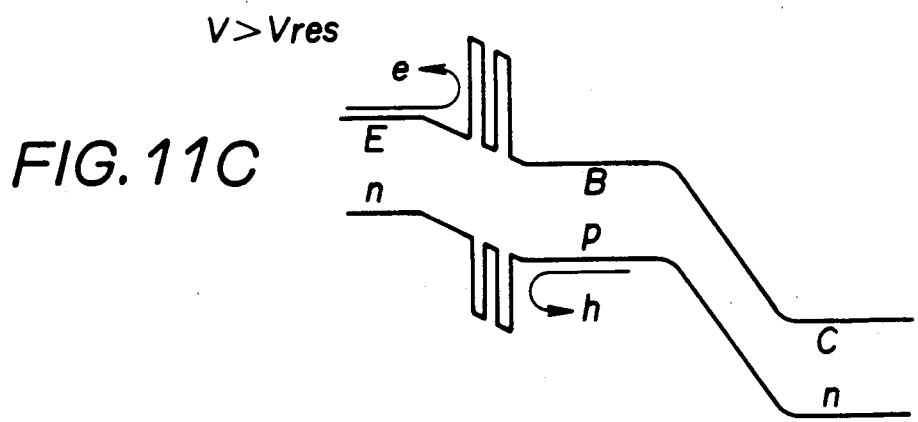

FIGS. 11A through 11C are schematic energy band diagrams for explaining operation of the semiconductor device having the structure shown in FIG. 10. In FIGS. 11A through 11C, the same reference symbols as those in the previous figures indicate the same elements or have the same meanings.

In FIG. 11A, when a base input voltage V is smaller than a voltage Vres at which the semiconductor device is changed into the resonant-tunneling state, the electrons e and holes h cannot be tunneled through the potential barriers $15B_2$ and $15B_1$, respectively.

In FIG. 11B, when V=Vres, both the electrons e and holes h are tunneled through the barriers $15B_2$ and $15B_1$ and correspondingly the electron concentration and the hole concentration in the well layer 15W increase. Therefore, the electrons and holes are recombined in the well layer 15W and emits a light hv.

In FIG. 11C, when V>Vres, the electrons e and holes h cannot be tunneled through the barriers $15B_2$ and $15B_1$, respectively, as in the case where V<Vres.

Figure 12:
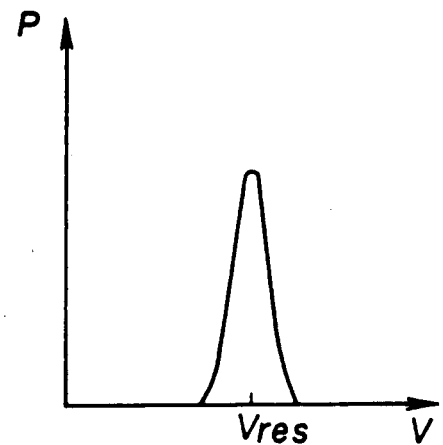
FIG. 12 is a graph of a light output versus a voltage characteristic of the semiconductor device shown in FIG. 10.

FIG. 12 shows a light output versus a voltage characteristic of the semiconductor device shown in FIG. 10. The horizontal axis represents the voltage V applied across the base and emitter, and the vertical axis represents the light output P. The characteristic diagram shows that when the applied voltage V becomes nearly equal to the voltage Vres at which the device is in the resonant state, the light output P appears. This light-emitting phenomenon corresponds to the operative state shown in FIG. 11B.

Figure 13:
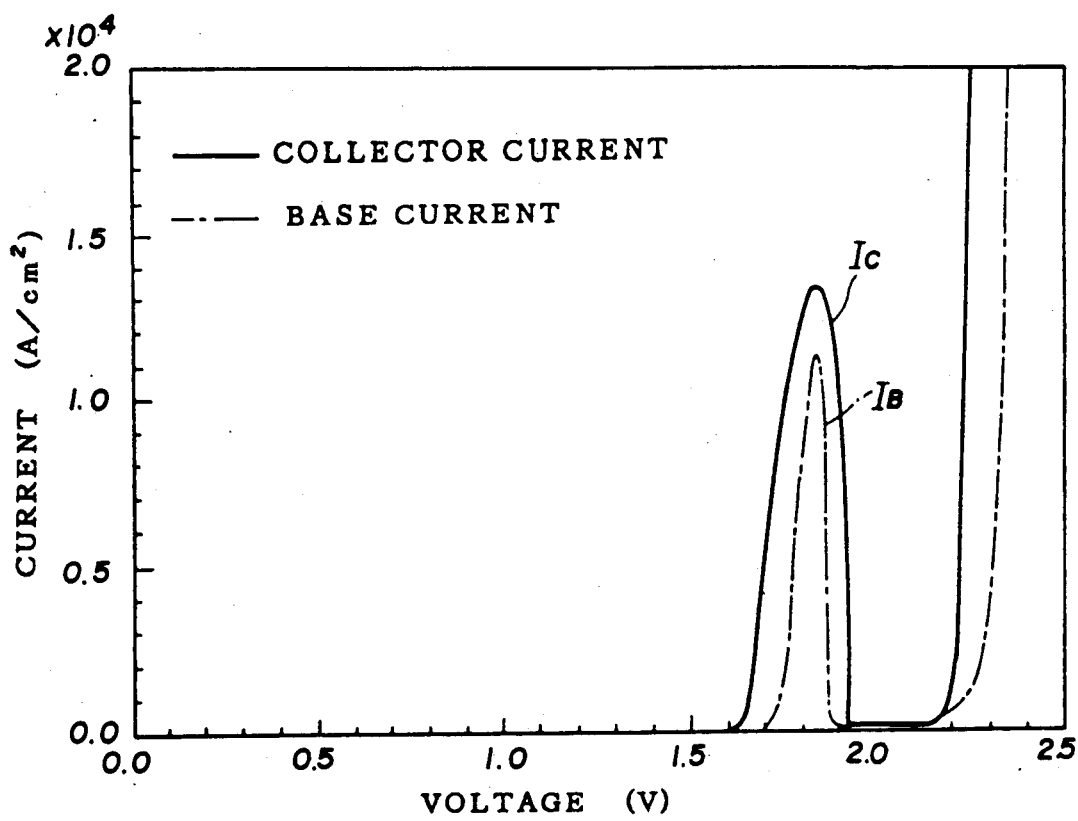
FIG. 13 is a graph of current-voltage characteristics of the semiconductor device shown in FIG. 10, in which the device is under the operative state shown in FIG. 11B.

FIG. 13 shows schematic current-voltage characteristics in the operative state shown in FIG. 11B. In FIG. 13, the same reference symbols as those in the previous figures indicate the same elements or have the same meanings. The horizontal axis represents the voltage V applied across the base and emitter, and the vertical axis represents the current I. Further, a solid line shows the collector current $I_C$ and a dotted chain line shows the base current $I_B$. The diagram indicates that both the collector current $I_C$ and the base current $I_B$ have peaks at the voltage of approximately 1.8 (V). This means that the resonant-tunneling of electrons and the resonant-tunneling of holes occur at this time.

Of course, the structure shown in FIG. 10 can operate as a diode, which exists between the base and emitter. It is also possible to configure only the diode by eliminating the layers 11, 12 and 21.

Figure 14A:
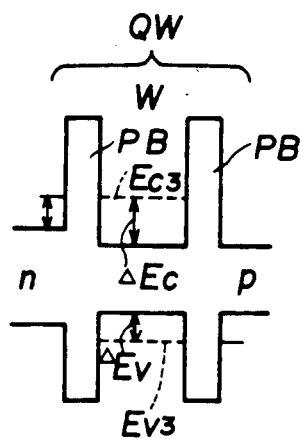
FIG. 14A is a schematic energy band diagram of another example of a semiconductor device according to the present invention.

FIG. 14A is a schematic energy band diagram of a semiconductor device corresponding to the energy band shown in FIG. 5B where the resonant energy level of the electrons, $Ec_3$ is larger than the energy level of the holes, $Ev_3$. An n-semiconductor layer is made of $(InGaAs)_{0.86}(InAlAs)_{0.14}$. A p-semiconductor layer is made of $In_{0.53}Ga_{0.47}As$. A quantum well layer QW consists of an $In_{0.53}Ga_{0.47}As$ well layer W and $In_{0.52}Al_{0.48}As$ potential barrier layers PB. The $In_{0.53}Ga_{0.47}As$ well layer W is 38 Å wide and the $In_{0.52}Al_{0.48}As$ potential barrier layers PB are each 44 Å wide. The resonant energy levels of the electrons and holes $Ec_3$ and $Ev_3$ in the well layer W thus structured are equal to 0.175 (eV) and 0.084 (eV), respectively. That is, the energy difference $\Delta Ec$ is larger than the energy difference $\Delta Ev$. For this reason, an n-semiconductor layer is made of $(InGaAs)_{0.86}(InAlAs)_{0.14}$ so that the band gap becomes wider to satisfy the condition discussed in the foregoing. The impurity concentration of the n-semiconductor layer is $1 \times 10^{18}$ (cm$^{-3}$). On the other hand, the impurity concentration of the p-semiconductor layer is $5 \times 10^{18}$ (cm$^{-3}$). The structure mentioned above is grown successively on an InP substrate (not shown).

Figure 14B:
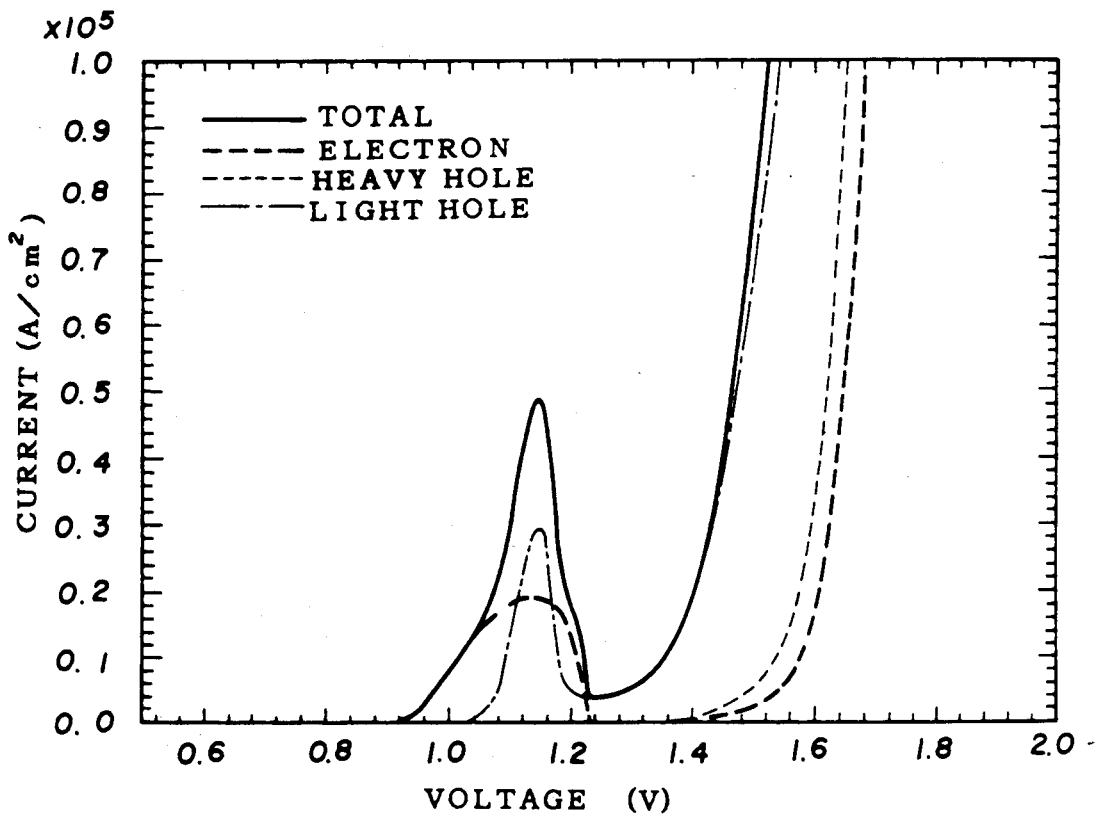
FIG. 14B is a graph of current-voltage characteristics of the semiconductor device having the energy band shown in FIG. 14A.

FIG. 14B shows current-voltage characteristics of the semiconductor device having the structure in FIG. 14A. The horizontal axis represents the voltage applied across the p- and n-semiconductor layer, and the vertical axis represents the current. The illustrated current-voltage characteristics show that the resonant-tunneling of the electrons and the resonant-tunneling of the (light) holes occur at the same time when the voltage around 1.16 (V) is applied to the device.

Figure 15A:
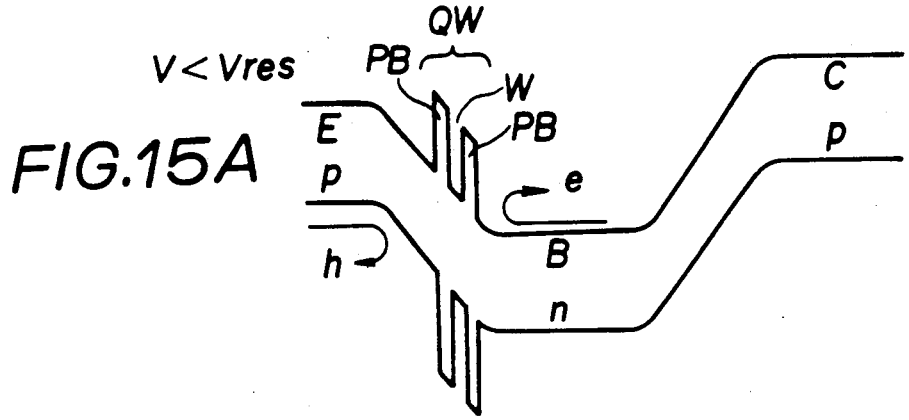
FIGS. 15A through 15C are schematic energy band diagrams of still another example of the semiconductor device according to the present invention.
Figure 15B:
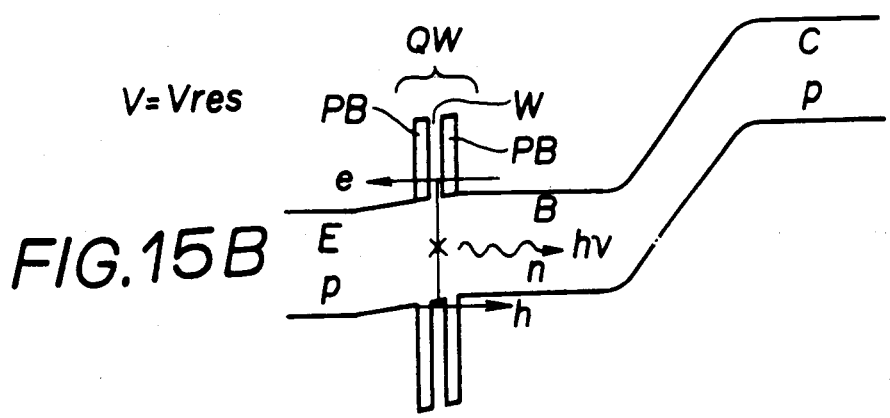
Figure 15C:
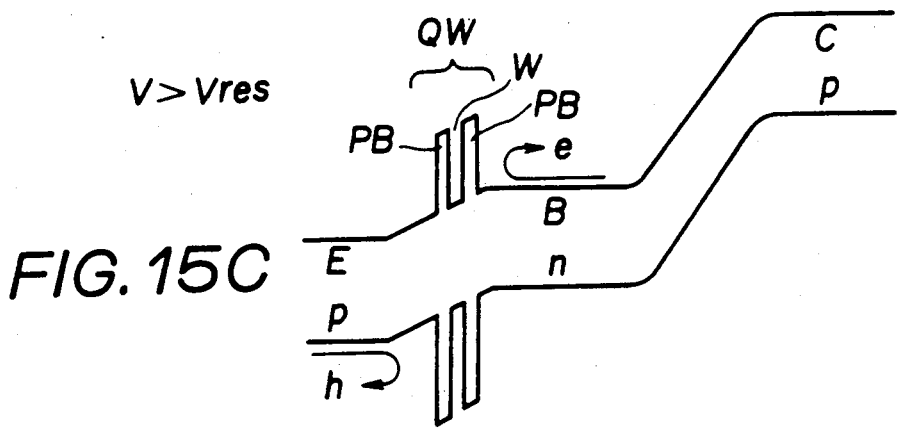

FIGS. 15A through 15C are schematic energy band diagrams of a pnp transistors according to the present invention. In these figures, the same reference symbols as those in the previous figures indicate the same elements or have the same meanings. The illustrated transistor has the condition shown in FIG. 5A in which the energy difference ΔEc is equal to the energy difference ΔEv. As shown from these figures, only when the voltage applied across the base and emitter is equal to the voltage Vres, the resonant-tunneling of electrons and the resonant-tunneling of holes occur at the same time.

A description will be given on a modification of the semiconductor devices described in the foregoing.

Figures 16A, 16B:
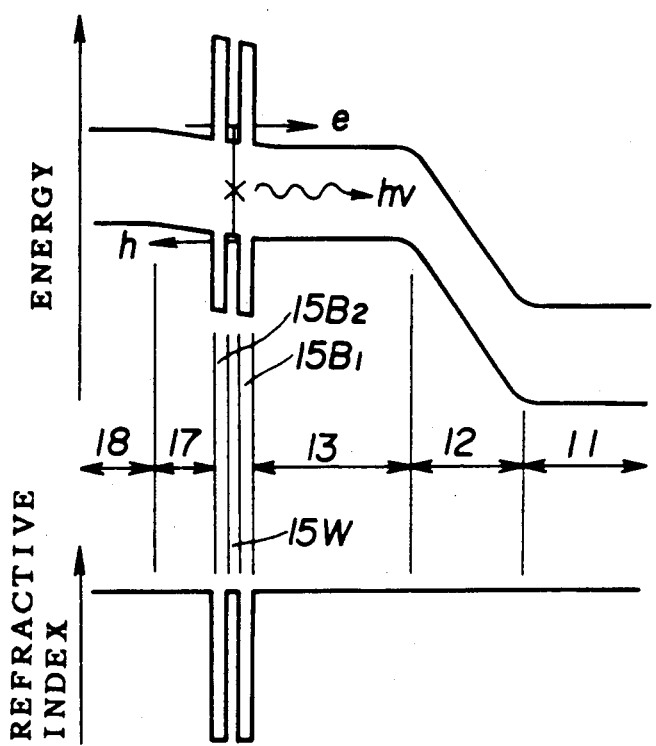
FIG. 16A is a schematic energy band diagram of the semiconductor device shown in FIG. 10.
FIG. 16B is a graph of a refractive index distribution of the semiconductor device shown in FIG. 10.

FIGS. 16A is a schematic energy band diagram of the semiconductor device shown in FIG. 10 where the resonant-tunneling of the electrons and holes occur at the same time, and FIG. 16B shows a refractive index distribution corresponding to the energy band shown in FIG. 16A. The refractive indexes of the AlAs barrier layers $15B_1$ and $15B_2$ are smaller than that of the GaAs well layer 15W in which the light may be emitted. Therefore, in this regard, the AlAs barrier layers $15B_1$ and $15B_2$ are suitable for a light confining layer. However, as described previously, the thickness of each of the AlAs barrier layers $15B_1$ and $15B_2$ is approximately 2 (nm) and is therefore very thin. For this reason, the AlAs barrier layers $15B_1$ and $15B_2$ cannot provide a sufficient light confining function. That is, the AlAs barrier layers $15B_1$ and $15B_2$ cannot effectively guide the light emitted in the GaAs well layer 15W towards an end surface of the device. It is considered that a thickness of approximately 100 nm of the barrier layers is necessary to establish a satisfactory light confining effect. However, setting the thickness to 100 nm or over is actually impossible, because such setting acts to degrade the performance of the resonant-tunneling.

As a result, a modification described below intends to form a light waveguide which guides the light emitted in the well layer towards the end surface of the device by constituting a light confining layer, so that the light-emitting efficiency can be improved.

FIG. 17A shows a schematic cross section of a modification having the features mentioned above, FIG. 17B shows a schematic energy band diagram of the modification shown in FIG. 17A where the bais voltage is applied, and FIG. 17C shows a refractive index distribution of the modification shown in FIG. 17A.

Referring to FIG. 17A, a quantum well resonator 34 is inserted between a base layer 33 and an emitter layer 35. The quantum well layer 34 consists of a GaAs well layer 34W and AlAs potential barrier layers $34B_1$ and $34B_2$ which are positioned on the bottom and top surfaces of the GaAs well layer 34W, respectively. The quantum well layer 34 may be grown by MOCVD, for example. The base layer 33 is mounted on an n-GaAs collector layer 32. This structure is grown on an $n^+$-GaAs substrate 31 by MBE, for example. On the top surface of the $p^+$-GaAs base layer 33, there are metallized base electrodes 38. On the top surface of the emitter layer 35, there is metallized an emitter electrode 37 through an $n^+$-GaAs emitter contact layer 36. A collector electrode 39 is metallized on the bottom surface of the $n^+$-GaAs substrate 31.

The base layer 33 is desired to have the band gap energy and the refractive index similar to those of an $In_{0.5}Al_{0.5}As$ mixed crystal. However, the $In_{0.5}Al_{0.5}As$ mixed crystal is not suitable for a material of the base layer 33. This is because the lattice constant of the $In_{0.5}Al_{0.5}As$ mixed crystal differs from that of GaAs forming the substrate 31. That is, the lattice mismatching occurs between the GaAs substrate 31 and the base layer 33 of the $In_{0.5}Al_{0.5}As$ mixed crystal. For this reason, the band gap and the refractive index of the base layer 33 are achieved by use of an InAs/AlAs strained-layer superlattice structure, which is a mixed crystal of $In_{0.5}Al_{0.5}As$. This mixed crystal has a periodical structure of alternatively stacked InAs layers and AlAs layers. Broken lines shown in FIG. 17A indicate the $In_{0.5}Al_{0.5}As$ mixed crystal.

An intermediate part of the emitter layer 35 is made of $Al_xGa_{1-x}As$ where the mole fraction x is equal to 0.3. In addition, the mole fraction x of the emitter layer 35 is graded from 0.0 to 0.3 in the range of 70 (nm) from the interface with the barrier layer $34B_2$. Thus the band gap energy in the vicinity of the interface with the quantum well structure 34 is graded, as shown in FIG. 17C. This is because there is a possibility that an abrupt band change would generate a spike. Furthermore, the AlGaAs mole fraction x of the emitter layer 35 is graded from 0.3 to 0.0 in the range of 70 (nm) from the interface with the GaAs emitter contact layer 36. The emitter layer 35 thus structured has the refractive index shown in FIG. 17C. As shown in this figure, the refractive index of the emitter layer 35 is smaller than that of the well layer 34W. This means that the emitter layer 35 forms the light confining layer.

Specifications of essential parts of the structure are shown in TABLE II.

TABLE II

| Layer | Composition | Impurity (cm$^{-3}$) | Thickness (nm) |
|---|---|---|---|
| Substrate 31 | GaAs | $n^+$ $-6 \times 10^{18}$ | |
| Collector 32 | GaAs | $n$ $-1 \times 10^{17}$ | 500 |
| Base 33 | Strained-layer superlattice 50 periods | | |
| | AlAs | $p^+$ $-5 \times 10^{18}$ | 2 |
| | InAs | $p^+$ $-5 \times 10^{18}$ | 2 |
| Barrier $34B_1$ | AlAs | non-doped | 2 |
| Well 34W | GaAs | non-doped | 5 |
| Barrier $34B_2$ | AlAs | non-doped | 2 |
| Emitter 35 | GaAs | | 70 |
| | ↓ | $n$ $-5 \times 10^{17}$ | |
| | $Al_{0.3}Ga_{0.7}As$ | ↓ | 100 |
| | ↓ | ↓ | 70 |
| | GaAs | $n$ $-5 \times 10^{17}$ | |
| Contact 36 | GaAs | $n^+$ $-6 \times 10^{18}$ | 200 |
| Electrode 37 | AuGe/Au/WSi | | 20/100/300 |
| Electrode 38 | Au/Zn/Au | | 10/10/300 |
| Electrode 39 | AuGe/Au | | 20/300 |

*A part of the base layer 33 in the vicinity of the barrier layer $34B_1$ is grown with the impurity non-doped in the range of the five periods.
*A 5 nm length part of the emitter layer 35 in the vicinity of the barrier layer $34B_2$ is grown with the impurity non-doped.

The band gap energy and the refractive index of each layer illustrated in FIG. 17A are shown in TABLE III.

TABLE III

| Composition | Band gap energy (eV) | Refractive index |
|---|---|---|
| GaAs | 1.14 | 3.655 |
| $Al_{0.3}Ga_{0.7}As$ | 1.79 | 3.300 |
| AlAs | 2.16 | 3.178 |
| $In_{0.5}Al_{0.5}As$ Mixed crystal | 1.35 | 3.340 |

As apparent from FIG. 17C and TABLE III, there are formed light confining layers having the refractive index smaller than that of the well layer 34W in the vicinity of the well layer 34W. The light emitted in the well layer 34W is guided towards the end surface of the substrate 31 by the light confining layers. Therefore, the light-emitting efficiency may be improved, as compared with the structure shown in FIG. 10A. Of course, the resonant-tunneling of the electrons and the resonant-tunneling of holes can occur at the same time, since the device satisfies the condition shown in FIG. 5A.

FIGS. 18A through 18C show another example of the semiconductor device having a light confining layer according to the present invention.

Referring to FIG. 18A, a quantum well resonator 44 is inserted between an $In_{0.52}Al_{0.48}As$ base layer 43 and an $In_{0.52}Al_{0.48}As$ emitter layer 45. The quantum well layer 45 consists of a GaAs well layer 44W and AlAs potential barrier layers $44B_1$ and $44B_2$ which are positioned on the bottom and top surfaces of the GaAs well layer 44W, respectively. The quantum well layer 44 may be grown by MOCVD, for example. The $In_{0.52}Al_{0.48}As$ base layer 43 is deposited on the top of an $In_{0.52}Al_{0.48}As$ collector layer 42. This structure is grown on an InP substrate 41 by MBE, for example. On the top surface of the $In_{0.52}Al_{0.48}As$ base layer 43, there are metallized base electrodes 48. On the top surface of the emitter layer 45, there is metallized an emitter electrode 47 through an InGaAsP emitter contact layer 46. A collector electrode 49 is metallized on the bottom surface of the $In_{0.52}Al_{0.48}As$ substrate 41.

Specifications of essential parts of the structure are shown in TABLE IV.

TABLE IV

| Layer | Composition | Impurity (cm$^{-3}$) | Thickness (nm) |
|---|---|---|---|
| Substrate 41 | InP | n$^+$ —6 × 10$^{18}$ | |
| Collector 42 | $In_{0.52}Al_{0.48}As$ | n —1 × 10$^{17}$ | 500 |
| Base 43 | $In_{0.52}Al_{0.48}As$ | p$^+$ —5 × 10$^{18}$ | 200 |
| Barrier 44B$_1$ | AlAs· | non-doped | 2 |
| Well 44W | GaAs | non-doped | 5 |
| Barrier 44B$_2$ | AlAs | non-doped | 2 |
| Emitter 45 | $In_{0.52}Al_{0.48}As$ | n —5 × 10$^{17}$ | 70 |
| Emitter contact 46 | $In_{0.52}Al_{0.48}As$ | n$^+$ —6 × 10$^{18}$ | 200 |
| Emitter electrode 47 | AuGe/Au/WSi | | 20/100/300 |
| Base electrode 48 | Au/Zn/Au | | 10/10/300 |
| Collector electrode 49 | AuGe/Au | 20/300 | |

*A 5 nm length part of the base layer 43 in the vicinity of the barrier layer 44B$_1$ is grown with the impurity non-doped.
*A 5 nm length part of the emitter layer 45 in the vicinity of the barrier layer 44B$_2$ is grown with the impurity non-doped.

The band gap energy and the refractive index of each layer are shown in FIGS. 18B and 18C. FIG. 18C reveals that there is formed the light confining layers having the refractive index smaller than that of the well layer 44W in the vicinity of the well layer 44W. Of course, the resonant-tunneling of electrons and the resonant-tunneling of holes can occur at the same time, because the device satisfies the condition shown in FIG. 5A.

The present invention is not limited to the embodiments, but various variations and modifications may be made without departing from the scope of the present invention.

What is claimed is:

1. A semiconductor device comprising:

a first n-type semiconductor layer having an energy level $Ec_1$ at the bottom of its conduction band and an energy level $Ev_1$ at the top of its valence band;

a second semiconductor layer having an energy level $Ec_2$ ($>Ec_1$) at the bottom of its conduction band and an energy level $Ev_2$ ($<Ev_1$) at the top of its valence band, the second layer being deposited on a surface of the first layer;

a third semiconductor layer having a resonant energy level $Ec_3$ ($<Ec_2$) of electrons in its conduction band and a resonant energy level $Ev_3$ ($>Ev_2$) of holes in its valence band, the third layer being deposited on a surface of the second layer;

a fourth semiconductor layer having an energy level $Ec_4$ ($>Ec_3$) at the bottom of its conduction band and an energy level $Ev_4$ ($<Ev_3$) at the top of its valence band, the fourth layer being deposited on a surface of the third layer; and a fifth p-type semiconductor layer having an energy level $Ec_5$ ($<Ec_4$) at the bottom of its conduction band and an energy level $Ev_5$ ($>Ev_4$) at the top of its valence band, the fifth layer being deposited on a surface of the fourth layer, wherein $|Ec_3-Ec_1|$ is approximately equal to $|Ev_3-Ev_5|$, and wherein when an energy $\Delta Ec$ which is a difference between the resonant energy level $Ec_3$ and an energy level $Ec_3'$ at the bottom of the conduction band of the third layer is larger than an energy $\Delta Ev$ which is a difference between the resonant energy level $Ev_3$ and an energy level $Ev_3'$ at the top of the valence band of the third layer, a band gap energy of the first layer is larger than that of the fifth layer.

2. A semiconductor device comprising:

a first n-type semiconductor layer having an energy level $Ec_1$ at the bottom of its conduction band and an energy level $Ev_1$ at the top of its valence band;

a second semiconductor layer having an energy level $Ec_2$ ($>Ec_1$) at the bottom of its conduction band and an energy level $Ev_2$ ($<Ev_1$) at the top of its valence band, the second layer being deposited on a surface of the first layer;

a third semiconductor layer having a resonant energy level $Ec_3$ ($<Ec_2$) of electrons in its conduction band and a resonant energy level $Ev_3$ ($>Ev_2$) of holes in its valence band, the third layer being deposited on a surface of the second layer;

a fourth semiconductor layer having an energy level $Ec_4$ ($>Ec_3$) at the bottom of its conduction band and an energy level $Ev_4$ ($<Ev_3$) at the top of its valence band, the fourth layer being deposited on a surface of the third layer; and a fifth p-type semiconductor layer having an energy level $Ec_5$ ($<Ec_4$) at the bottom of its conduction band and an energy level $Ev_5$ ($>Ev_4$) at the top of its valence band, the fifth layer being deposited on a surface of the fourth layer, wherein $|Ec_3-Ec_1|$ is approximately equal to $|Ev_3-Ev_5|$, and wherein the first layer is made of $(InGaAs)_{1-x}(InAlAs)_x$, the second and fourth layers are made of $In_yAl_{1-y}As$, and the third and fifth layers are made of $In_zGa_{1-z}As$.

3. A semiconductor device comprising:

a first n-type semiconductor layer having an energy level $Ec_1$ at the bottom of its conduction band and an energy level $Ev_1$ at the top of its valence band;

a second semiconductor layer having an energy level $Ec_2$ ($>Ec_1$) at the bottom of its conduction band and an energy level $Ev_2$ ($<Ev_1$) at the top of its valence band, the second layer being deposited on a surface of the first layer;

a third semiconductor layer having a resonant energy level $Ec_3$ ($<Ec_2$) of electrons in its conduction band and a resonant energy level $Ev_3$ ($>Ev_2$) of holes in its valence band, the third layer being deposited on a surface of the second layer;

a fourth semiconductor layer having an energy level $Ec_4$ ($>Ec_3$) at the bottom of its conduction band and an energy level $Ev_4$ ($<Ev_3$) at the top of its valence band, the fourth layer being deposited on a surface of the third layer; and a fifth p-type semiconductor layer having an energy level $Ec_5$ ($<Ec_4$) at the bottom of its conduction band and an energy level $Ev_5$ ($>Ev_4$) at the top of its valence band, the fifth layer being deposited on a surface of the fourth layer, wherein $|Ec_3-Ec_1|$ is approximately equal to $|Ev_3-Ev_5|$, and wherein the first layer is made of $Al_xGa_{1-x}As$, the second and fourth layers are made of AlAs, the third layer is made of GaAs, and fifth layer is made of an InAs/AlAs strained-layer superlattice structure.

4. A semiconductor device comprising:

a first n-type semiconductor layer having an energy level $Ec_1$ at the bottom of its conduction band and an energy level $Ev_1$ at the top of its valence band;

a second semiconductor layer having an energy level $Ec_2$ ($>Ec_1$) at the bottom of its conduction band and an energy level $Ev_2$ ($<Ev_1$) at the top of its valence band, the second layer being deposited on a surface of the first layer;

a third semiconductor layer having a resonant energy level $Ec_3$ ($<Ec_2$) of electrons in its conduction band and a resonant energy level $Ev_3$ ($>Ev_2$) of holes in its valence band, the third layer being deposited on a surface of the second layer;

a fourth semiconductor layer having an energy level $Ec_4$ ($>Ec_3$) at the bottom of its conduction band and an energy level $Ev_4$ ($<Ev_3$) at the top of its valence band, the fourth layer being deposited on a surface of the third layer; and a fifth p-type semiconductor layer having an energy level $Ec_5$ ($<Ec_4$) at the bottom of its conduction band and an energy level $Ev_5$ ($>Ev_4$) at the top of its valence band, the fifth layer being deposited on a surface of the fourth layer, wherein $|Ec_3-Ec_1|$ is approximately equal to $|Ev_3-Ev_5|$, and wherein the first layer is made of $In_xAl_{1-x}As$, the second and fourth layers are made of AlAs, the third layer is made of GaAs, and fifth layer is made of $In_yAl_{1-y}As$.

5. A semiconductor device comprising:

a first n-type semiconductor layer having an energy level $Ec_1$ at the bottom of its conduction band and an energy level $Ev_1$ at the top of its valence band;

a second semiconductor layer having an energy level $Ec_2$ ($>Ec_1$) at the bottom of its conduction band and an energy level $Ev_2$ ($<Ev_1$) at the top of its valence band, the second layer being deposited on a surface of the first layer;

a third semiconductor layer having a resonant energy level $Ec_3$ ($<Ec_2$) of electrons in its conduction band and a resonant energy level $Ev_3$ ($>Ev_2$) of holes in its valence band, the third layer being deposited on a surface of the second layer;

a fourth semiconductor layer having an energy level $Ec_4$ ($>Ec_3$) at the bottom of its conduction band and an energy level $Ev_4$ ($<Ev_3$) at the top of its valence band, the fourth layer being deposited on a surface of the third layer; and a fifth p-type semiconductor layer having an energy level $Ec_5$ ($<Ec_4$) at the bottom of its conduction band and an energy level $Ev_5$ ($>Ev_4$) at the top of its valence band, the fifth layer being deposited on a surface of the fourth layer, wherein $|Ec_3-Ec_1|$ is approximately equal to $|Ev_3-Ev_5|$, and wherein when an energy $\Delta Ec$ which is a difference between the resonant energy level $Ec_3$ and an energy level $Ec_3'$ at the bottom of the conduction band of the third layer is smaller than an energy $\Delta Ev$ which is a difference between the resonant energy level $Ev_3$ and an energy level $Ev_3'$ at the top of the valence band of the third layer, a band gap energy of the first layer is smaller than that of the fifth layer.

6. A semiconductor device comprising:

a first n-type semiconductor layer having an energy level $Ec_1$ at the bottom of its conduction band and an energy level $Ev_1$ at the top of its valence band;

a second semiconductor layer having an energy level $Ec_2$ ($>Ec_1$) at the bottom of its conduction band and an energy level $Ev_2$ ($<Ev_1$) at the top of its valence band, the second layer being deposited on a surface of the first layer;

a third semiconductor layer having a resonant energy level $Ec_3$ ($<Ec_2$) of electrons in its conduction band and a resonant energy level $Ev_3$ ($>Ev_2$) of holes in its valence band, the third layer being deposited on a surface of the second layer;

a fourth semiconductor layer having an energy level $Ec_4$ ($>Ec_3$) at the bottom of its conduction band and an energy level $Ev_4$ ($<Ev_3$) at the top of its valence band, the fourth layer being deposited on a surface of the third layer; and a fifth p-type semiconductor layer having an energy level $Ec_5$ ($<Ec_4$) at the bottom of its conduction band and an energy level $Ev_5$ ($>Ev_4$) at the top of its valence band, the fifth layer being deposited on a surface of the fourth layer, wherein $|Ec_3-Ec_1|$ is approximately equal to $|Ev_3-Ev_5|$, and wherein the refractive indexes of the first and fifth layers are smaller than the refractive index of the third layer.

7. A semiconductor device as claimed in claim 3, wherein a mole fraction x of the first layer of $Al_xGa_{1-x}As$ is graded.

UNITED STATES PATENT AND TRADEMARK OFFICE
CERTIFICATE OF CORRECTION

PATENT NO. : 5,031,005

DATED : July 9, 1991

INVENTOR(S) : TOSHIRO FUTATSUGI, NAOKI YOKOYAMA and KENICHI IMAMURA

It is certified that error appears in the above-identified patent and that said Letters Patent is hereby corrected as shown below:

Column 10, line 48, under "TABLE II", column 3, delete

"20/300", column 4, insert --20/300--.

Column 11, line 44, under "TABLE IV", column 3, delete

"20/300", column 4, insert --20/300--.

Signed and Sealed this

Twenty-ninth Day of December, 1992

Attest:

DOUGLAS B. COMER

Attesting Officer     Acting Commissioner of Patents and Trademarks